United States Patent [19]
Grotz

[11] Patent Number: 5,303,116
[45] Date of Patent: Apr. 12, 1994

[54] SURGE PROTECTOR

[75] Inventor: Glenn F. Grotz, Cranbury, N.J.

[73] Assignee: MCG Electronics Inc., Deer Park, N.Y.

[21] Appl. No.: 760,740

[22] Filed: Sep. 16, 1991

[51] Int. Cl.$^5$ .................... H02H 3/20; H02H 9/04; H01R 9/09
[52] U.S. Cl. .................... 361/111; 361/56; 361/774; 361/777
[58] Field of Search .......... 307/109; 361/111, 112, 361/400, 401, 402, 403, 404, 405, 406, 407, 408, 409, 410, 56, 114

Primary Examiner—A. D. Pellinen
Assistant Examiner—Ronald W. Leja
Attorney, Agent, or Firm—Bauer & Schaffer

[57] ABSTRACT

A surge protector or transient suppressors for AC power lines having its components mounted on a circuit board. The metalization of the board are configured to present as large a surface area as possible, given the topology of the board, to the flow of current. A return conductor is placed on the opposite side of the board with a large surface area corresponding to the first conductor. The magnetic field between the two conductors is substantially cancelled. This configuration reduces the magnetic field intensities associated with the flow of current, thereby reducing self-inductance.

18 Claims, 3 Drawing Sheets

SURGE PROTECTOR

FIELD OF THE INVENTION

This invention relates to a method and apparatus for improving surge protectors against overvoltage and, more particularly, to the enhanced construction of transient suppressors used on AC power lines.

BACKGROUND OF THE INVENTION

Overvoltage surge protectors are used in many electrical and electronic circuitry. For example, it is well known that the semiconductor junctions that make up the solid state devices used in discrete transistor and integrated circuits are very sensitive to overvoltages. A voltage spike of even transient duration can destroy a given junction and render the electronic equipment of which it is part inoperable. Typically, these voltage spikes represent a high amplitude, short duration overvoltage pulse, or, sometimes, ringwave. The form or type of pulse depends on such things as cause of transient, impedance of the line, and load impedance.

Electrical surges or transients are inevitable. Typically, they are created by lightning, electric utility switching operations, and the cycling on and off of large inductive loads. Rural locations have more direct exposure to lightning. Metropolitan areas are more likely to experience switching transients. Factories are also subjected to internally generated transients created by the starting and stopping of electrical machinery such as arc welders and punch presses. In office buildings, copy machines or elevators may be principal surge producers.

The responsibility rests with the user to install transient overvoltage protection which will attenuate power line disturbances to a safe nondestructive level which matches the voltage tolerances of the equipment protected.

After documenting surges on AC power circuits, engineers arrived at an industry consensus on a practical guide for describing surge voltages on AC power circuits rated up to 600 volts. The resulting IEEE Std. 587-1980 has become American National Standard ANSI/IEEE C62.41-1980. This is the principal reference for surge current and surge voltage waveforms and amplitudes when evaluating transient voltage suppressors. The reference lists three standard waveforms, two of which are impulse and ringwave, and three location categories, two of which are service entrance and panelboard.

Generally, the objective is to clip the transient as quickly as possible by providing a low impedance path for same at a defined voltage level. The more inductance there is between the actual protective device (MOV or zener diode) and the line being clamped or protected, the less effective is the spike arresting action. The actual clamping voltage of the protective device can be stated as follows:

Clamping Voltage = MOV voltage + the IR drop of the wiring + LdI/dT where
L = inductance
I = current
T = time
R = resistance Hence it is desirable to reduce the inductance to as low a level as possible and thereby increase the effectiveness of the protective device. Normal runs of wire, either independently connected or on conventional circuit boards, have considerable self-inductance, and this leads to reduced effectiveness of the spike arrester.

It is the object of the present invention to provide improved surge protectors and transient overvoltage arresters, overcoming the disadvantages and difficulties of the prior art devices.

It is another object to provide an improved circuit board having minimal inductance for use in electrical and/or electronic devices such as surge protectors.

Other objects and features of the present invention will become apparent from the following detailed disclosure considered in connection with the accompanying drawings.

SUMMARY OF THE INVENTION

According to the present invention, a surge protector transient suppressor is provided wherein the various components thereof are mounted on thin, but relatively rigid and nonconductive circuit board wherein metalizations forming the circuit leads of the board are configured to present as large a surface area as possible, given the topology of the board, with the longest dimension transverse to the flow of current. Further, it is preferred in the present invention to arrange the flow of current on the top surface of the board to run in an opposite direction to the current on the bottom surface of the boards, thereby obtaining significant magnetic flux cancellation, hence reduction of inductance.

In general, the present invention provides a circuit board in which is eliminated point-to-point wiring, which is particularly beneficial in the implementation of an overvoltage protective system for multiphase AC lines. All connections between the lines are protected, and the protective or clamping devices are realized by relatively large surface area runs of PC plating or metalization of conventional claddings, preferably copper. Hence, the connecting "wire" of the inventive structure is formed of large regions of PC metalization. These regions are designed to have as large a surface area as possible, given the topology of the board.

The large surface area afforded by the various PC claddings or metal lands acts to reduce the land's self-inductance (when compared to conventional point-to-point wiring) by reducing the intensity of the magnetic field associated with the flow of current therethrough. Reduced magnetic intensity means reduced self-inductance.

Moreover, by increasing the surface area of the conductor through which current flows, the given conductor's resistance is reduced. This acts to reduce the IR drop through the same yielding a more effective clamping circuit.

Another important feature of the inventive structure is the fact that the PC board is double-sided. Hence, the metalization on one side of the board, being in close confronting disposition with respect to the metalizations on the other, acts to neutralize the flux patterns and further may be employed to create a ground-plane effect. Such ground-plane can act further to reduce the intensity of the voltage spikes, owing to the capacitance between the metalizations on the confronting faces or sides of the board.

Full details of the present invention, as applied particularly to a surge protector, are set forth in the following description and illustrated in the accompanying drawings. It will be appreciated from this description that the principles of the invention can be applied to other circuitry as well.

BRIEF DESCRIPTION OF THE DRAWINGS

In the drawings, wherein the same reference numeral denotes the same element throughout the several figures.

DETAILED DESCRIPTION OF THE INVENTION

Figure 1:
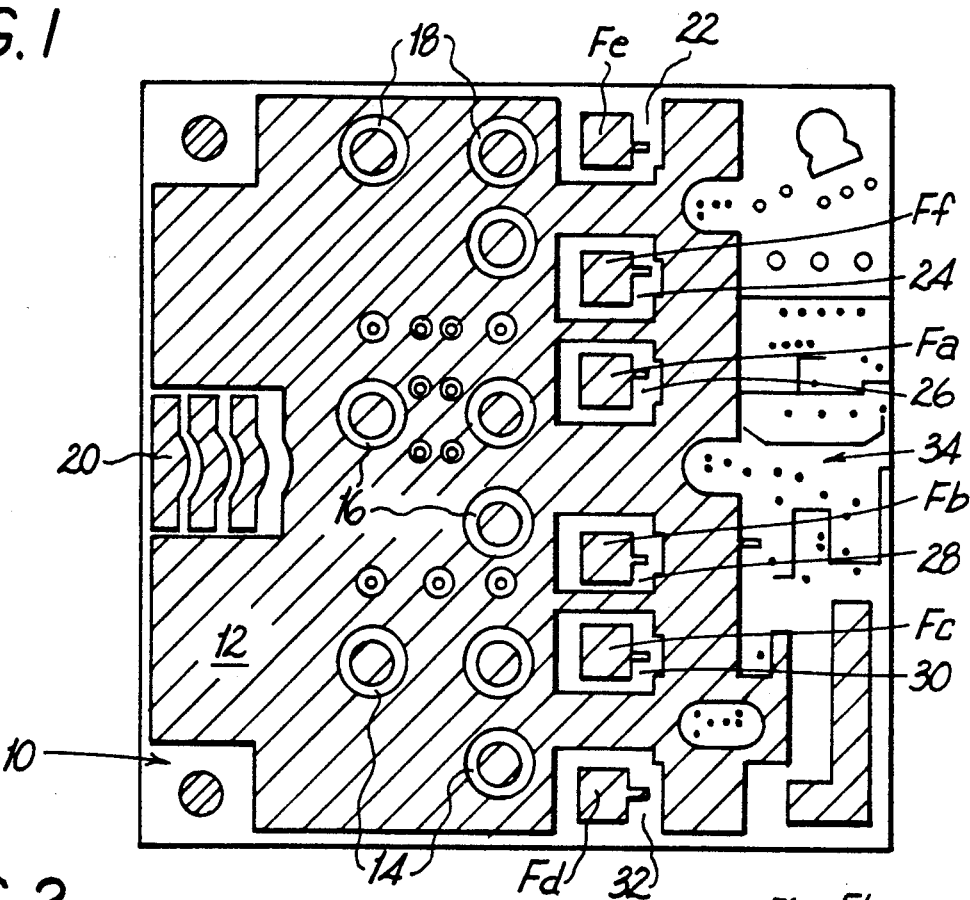
FIG. 1 is a plan view of the metalization on the component side of a circuit board using the inventive technique.
Figure 2:
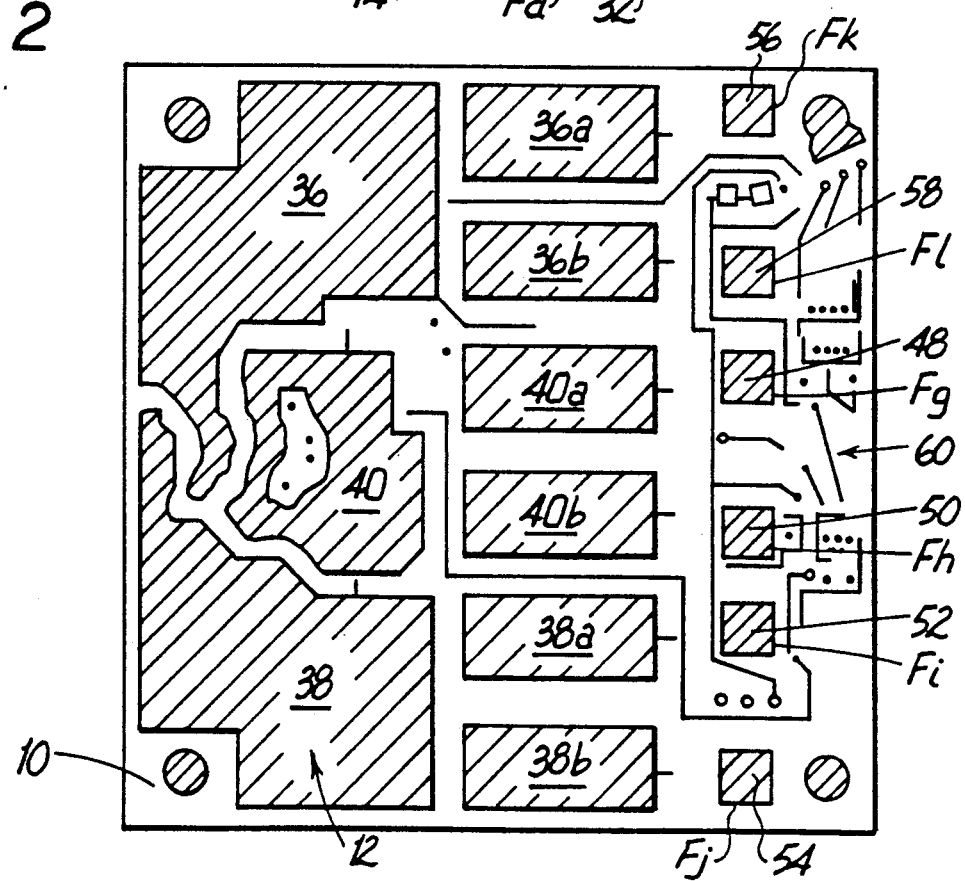
FIG. 2 is a plan view of the metalization on the other side of the circuit board shown in FIG. 1.
Figure 3:
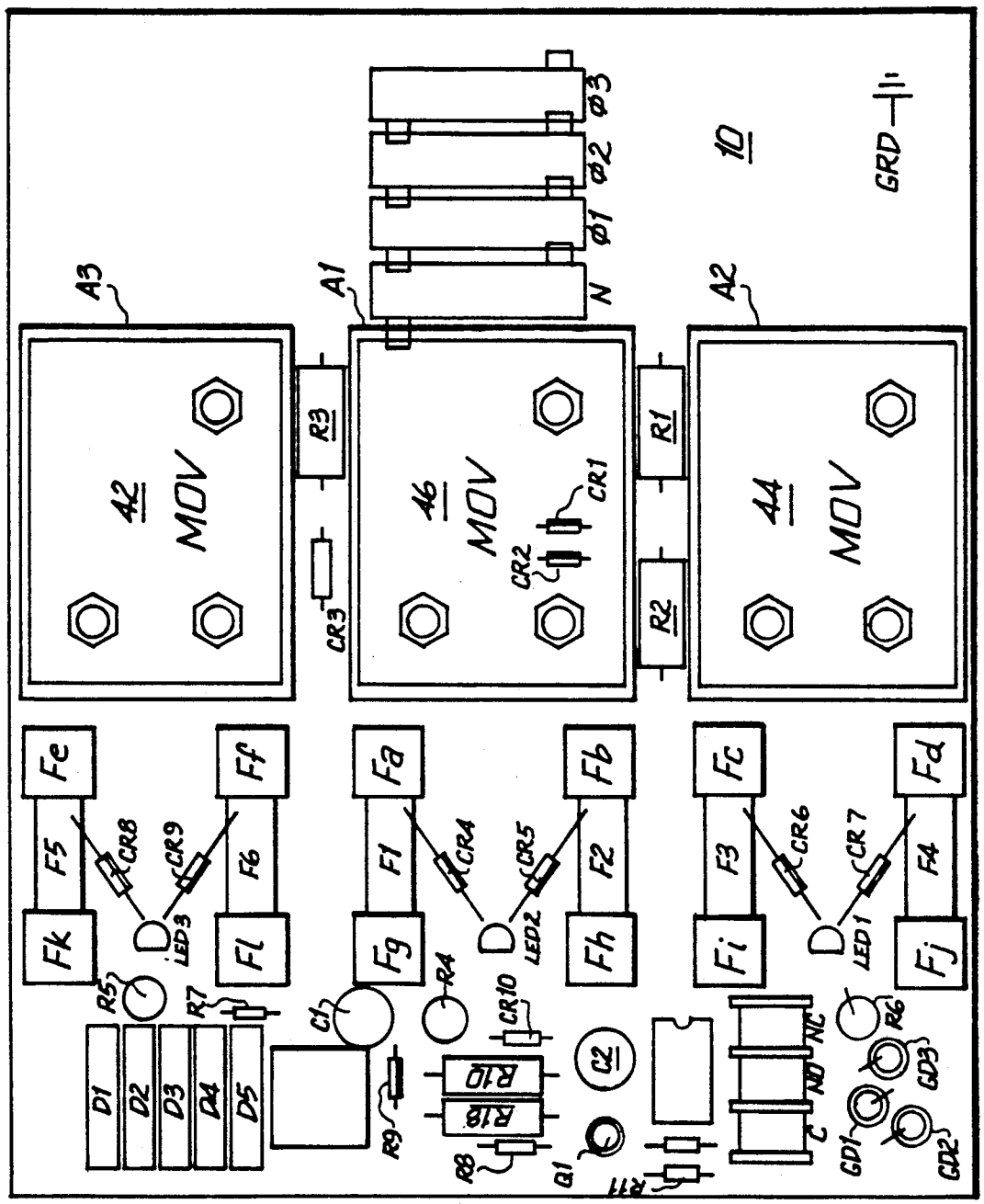
FIG. 3 is a plan view showing component placement on the side of the circuit board shown in FIG. 1.

In detail now and referring to the FIGS. 1-3, there is shown a PC board, indicated generally as reference number 10, upon which the components of a multiphase AC surge protector are mounted. In accordance with the inventive technique and structure, metalization or lands are placed on both sides of board 10. More specifically and as seen in FIG. 1, a broad ground-plane metalization 12 is deposited on the component side of board 10. Metalization 12 is electrically connected to circuit ground. The metalization may be of copper foil, copper deposition, or of other highly conductive material, conventionally used in circuit board construction. The PC board as well is of standard material used therefor, and it too is preferable as thin as possible, given the parameters of the circuitry and provided no arc or shorting occurs. Reference, of course, is made to conventional and customary techniques and construction not described herein.

As seen in FIG. 1, the various component areas are etched out of neutral-plane metalization 12. Typically, these etched out regions will include MOV module socket isolation spaces 14, 16, 18 (each group of isolation spaces 14, 16, and 18 defines a triad of plated-through MOV sockets, discussed below); multiphase terminal block isolation spaces 20; fuse clip isolation spaces 22, 24, 26, 28, 30, 32. As will be noted below, the various PC traces for the low power self-diagnostic electronics is collectively seen as numeral 34. In this manner, the conductive metalizations that are isolated by the respective aforementioned spaces are electrically insulated, where appropriate, from neutral-plane metalization 12. Further, and where appropriate, the conductive regions isolated by the aforenoted isolation spaces are plated-through to the PC lands on the other side of the board, as will be noted below.

In FIG. 2, the metalizations or conductive lands on the opposite side of board 10 are shown. Lands 36, 38, and 40 couple a respective AC phase line to an associated MOV socket as seen in FIG. 3. Each land 36, 38, and 40 might be called a first metalization for each respective AC phase line. Each group of the three MOV sockets receives a corresponding removable MOV module 42, 44, and 46. A further group of low inductive lands 36a and 36b, 38a and 38b, and 40a and 40b are carried on the last-mentioned side of board 10 as shown. Each group of the last-mentioned lands—that is, land groups 36a and 36b, 38a and 38b, and 40a and 40b—might be considered as respective second metalizations for each AC phase line. It will be noticed, and now reference is made to FIG. 4, that each group of such second metalizations forms a redundant pair for its associated MOV module 42, 44, or 46. Each land of this second metalization group (that is, lands 36a and 36b, 38a and 38b, and 40a and 40b) is in electrical communication with a corresponding MOV module socket on one end and, by plated-through connection, to an associated fuse , clip Fa-Ff on the other (FIG. 3). Fuse clip lands 48, 50, 52, 54, 56 and 58 are electrically coupled to associated fuse clips Fg-Fl by plating-through. Lands 48, 50, 52, 54, 56 and 58 are also carried on the last-mentioned side of PC board 10 as well as the remaining lands, collectively numbered 60 in FIG. 2, of the self-diagnostic circuitry carried on board 10.

It will be noticed that conductive patterns 36, 36a, 36b; 38, 38a, 38b; and 40, 40a, 40b, are as wide as the real estate of board 10 will allow, while the length, i.e. the direction in which the current flows and returns should be as short as possible—that is, in enlarging the width of the current field relative to its length, the magnetic field flux pattern induced by the current flow is lengthened, and consequently the magnetic field strength is correspondingly reduced. In use and operation of the invention and with the PC board geometry shown, whether with only a first metalization on one side and a second metalization on the other side, the lands described afford a large surface area to the flow of current, thereby reducing the magnetic field intensities and IR drops associated therewith when compared to conventional wiring or PC techniques. Since metalization 12 is in close proximity to the confronting side of board 10, and more or less overlays the same, a ground-plane is formed and this further acts to reduce, by a shunt capacitance effect, high frequency components of a transient.

Since metalization 12 overlays 36, 38, and 40, current flowing in opposite directions results in magnetic flux cancellation. Further, the length of magnetic field path surrounding the circuit has been substantially increased by the wide metalization conductors. Together, both effect a reduction in inductance by several orders of magnitude over conventional wiring.

Another advantageous feature of the present invention arises by the fact that the flow of current or conductive pattern may be arranged so that the direction of flow on one side of the PC board is opposite to the direction of flow on the other side. As a result of the substantially similar but opposite flow patterns, the magnetic fields are substantially cancelled. Such an advantage cannot be obtained in conventional wire or circuit board connection, where the flux pattern is circular about the conductor.

Figure 4:
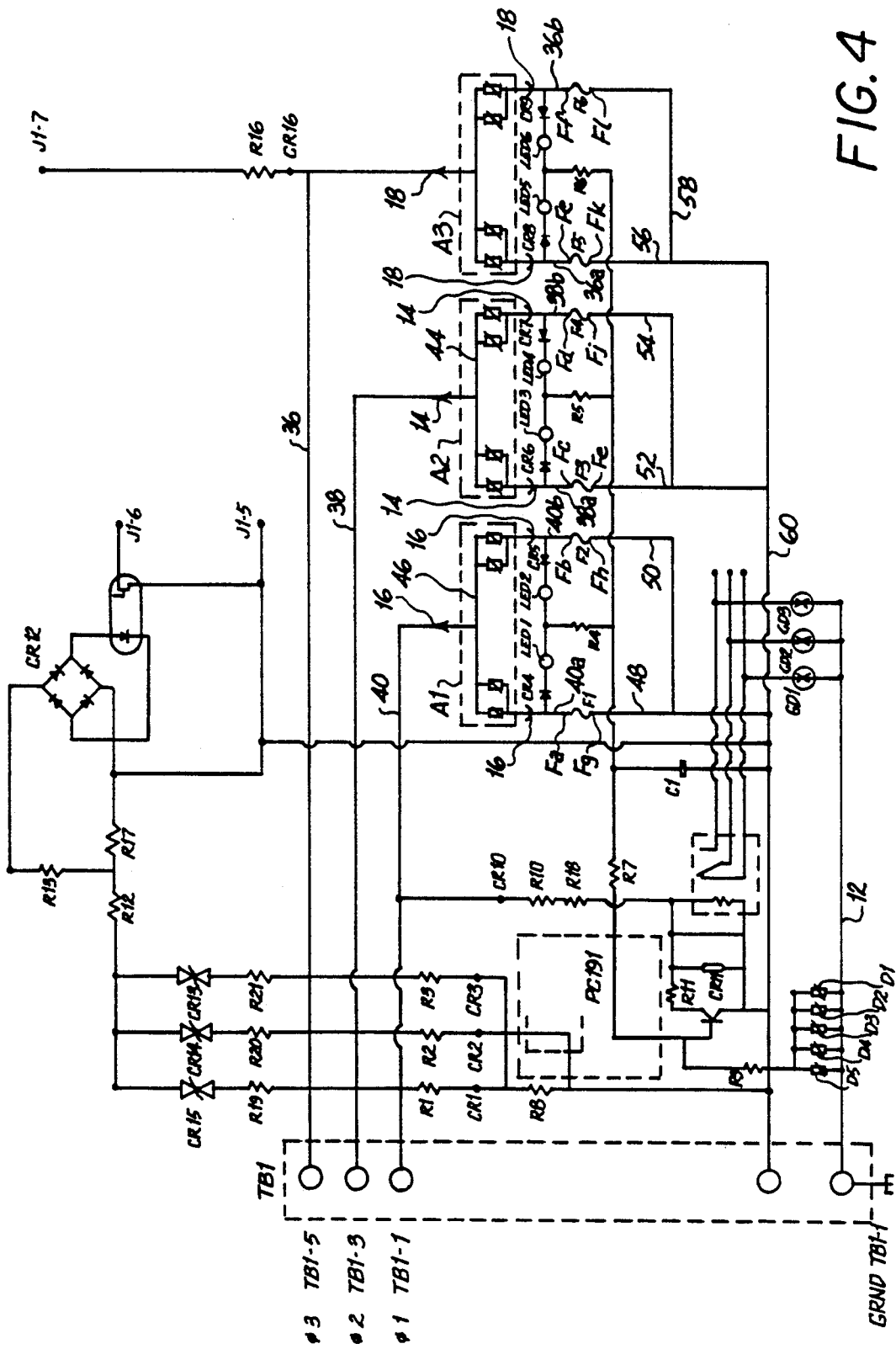
FIG. 4 is an electrical schematic of a surge suppressor for multiphase AC power lines that includes self-diagnostics corresponding with the PC metalization shown in FIG. 1.

Turning now to FIG. 4, there is shown in electrical schematic how the inventive techniques of FIGS. 1-3 can be implemented in building a multiphase (in this case, three phase) AC transient suppressor with enhanced features. In the implementation shown, removable MOV modules 42, 44, and 46 are electrically coupled to terminal block TBl by means of respective relatively wide, low inductive strips 36, 38, and 40. The other side of each MOV module is, by means of respective lands 36a, 36b; 38a, 38b; and 40a, 40b, electrically coupled to one side of respective field replaceable fuse groups F5, F6; F3, F4; and F1, F2. The other side of each fuse is respectively connected to an associate low inductive land 56, 58; 52, 54; and 48, 50. A low inductive lead 60 electrically connects each of the last-mentioned lands to the neutral phase of block TB1.

Reversing the direction of circuit current to neutral under the fuse and MOV module affords some magnetic field cancellation and some reduction of inductance.

It is to be noted that each second metalization land groups 36a and 36b; 38a and 38b; and 40a and 40b includes inherent redundancy because each corresponding MOV module 42, 44, and 46 comprises separate banks of MOVs. In less enhanced or expensive versions of the invention this second metalization group for each MOV could be replaced with single land. When such is single land might be referred to as a neutral metalization.

The circuitry of FIG. 4 includes on-board self-diagnostics. This diagnostics includes LEDS to indicate that protection is in effect and to warn if a MOV module needs to be replaced. In addition, remote alarm capability is implemented along with means for counting the number of times transients are detected and absorbed, i.e. MOV module fires.

Preferably board 10 and its mounted components are housed in a rugged NEMA-12 housing, and as is apparent from what is disclosed above, all components that are subject to burn-out are placed in sockets or clips for ease of repair.

It is seen from the foregoing that the present invention provides a circuit board layout for efficient use of a spike absorber for multiphase AC lines, wherein the conductive lands are maximized to present a wide surface area normal to the direction of current flow resulting in a reduced associated inductive and IR drop.

The present invention provides means for electrically coupling the suppression device to a selected phase of a multiphase AC line wherein such means tends to minimize the magnetic field intensity associated with the flow of current between the given AC phase line and the associated device, thereby increasing the effectiveness of the suppression.

While only one embodiment of the present invention is shown and described, it is to be understood that many changes and modifications can be made hereto without departing from the spirit and scope hereof.

What is claimed is:

1. A PC board adapted to carry a transient suppression device for AC power lines and configured to enhance the operation of such device comprising a first metalization on one side of the board, said first metalization electrically coupling the line being protected to one side of the suppression device, said first metalization having as large a surface area as possible to provide a low impedance path between the line being protected and the suppression device, a second metalization electrically coupled to the other side of the suppression device and having as large a surface area as possible to provide a low impedance path between said other side of the suppression device and the line being protected, said second metalization being placed on the other side of the board in opposition with said first metalization so that in plan said second metalization overlies as much of said first metalization as possible whereby the magnetic flux is cancelled and the magnetic path length is maximized, thus minimizing inductance.

2. The PC board according to claim 1, wherein the surface of the metalization is provided with a width larger than the length parallel to the direction of current flow.

3. The PC board according to claim 2, including fuseable link means interposed between said second metalization and the line.

4. The PC board according to claim 3, including means carried on said board for indicating when the suppression device is inoperative.

5. The PC board according to claim 4, including means carried on said board for indicating that the suppression device is energized.

6. A surge protector for an AC power line having a plurality of components mounted on a circuit board, comprising a first metalization on one side of the board, said first metalization being electrically coupled to the line being protected and, said first metalization having as large a surface area as possible to provide a low impedance path, a group metalization on the other side of the board, said ground metalization having as large a surface area as possible and being connected to the neutral phase of the line being protected to provide a low impedance path, said group metalization being placed on the other side of the board in opposition with said first metalization so that in plan view said ground metalization overlies as much of said first metalization as possible whereby said ground metalization functions to cancel the magnetic fields minimizing circuit inductance and said first and ground metalizations from a capacitor, reducing high frequency components of the transient.

7. The surge protector according to claim 6, including socket means embedded in the board to carry the suppression device.

8. The surge protector according to claim 7, wherein the suppression device is in the form of a removable module adapted to seat in said socket means.

9. The surge protector according to claim 8, wherein the suppression device comprises a MOV.

10. A PC board adapted to carry a plurality of transient suppression devices for multiphase AC power lines, wherein a given AC phase line is protected by an associated transient suppression device comprising spaced first and second metalizations carried on one side of the PC board and associated with a given one of the AC phase lines, said first metalization electrically coupling the given phase line being protected and one side of a corresponding suppression device, said first metalization having as large a surface area as possible to provide a low impedance path between the given phase line being protected and the corresponding suppression device, said second metalization being electrically coupled to the other side of the corresponding suppression device and having as large a surface area as possible to provide a low impedance path between said other side of the corresponding suppression device and the neutral line of said multiphase AC line, and a neutral metalization being placed on the other side of the PC board in opposition with said first and second metalizations of each phase line so that in plan said neutral metalization overlies as much of said first metalization as possible whereby the close confronting disposition of said first and second metalizations with respect to said neutral metalization combines to negate inductance and form a neutral system acting as a shunt capacitor for high frequency components of a transient riding on any one of the AC phase lines.

11. The PC board according to claim 10, including a set of sockets placed in the PC board, each set of sockets being selectively receiving a given one of the suppression devices whereby a given one of the suppression device protecting an associated AC phase line can be removed from the PC board independently of the other suppression devices.

12. The PC board according to claim 11, wherein each one of said corresponding suppression devices is in the form of an MOV module.

13. The PC board according to claim 12, including self-diagnostic circuit means carried on the PC board to monitor the status of a given suppression device and indicate when the same is operable or inoperable.

14. A circuit board adapted to carry a plurality of interconnected electrical components powered by a multiphase AC power source, comprising at least a first metalization on one side of the board, said first metalization electrically coupling the line being protected and one or more of said components, said first metalization having as large a surface area as possible given the topology of the board associated components, and at least a second metalization having as large a surface area as possible given the topology of the board on the other side of the board in opposition with said first metalization so that in plan view said second metalization overlies as much of said first metalization as possible given the board topology, said first and second metalizations producing low impedance paths between said source and components and flux produced thereby is neutralized, and the inductance is minimized.

15. The circuit board according to claim 14, wherein the surface areas of the metalizations are provided with a width substantially larger than the length parallel to the direction of current flow.

16. A method for reducing the impedance produced in circuit boards, carrying a plurality of electrical and/or electronic components interconnected to a multiphase AC power source comprising the steps of: providing a first layer of metalization on one side of said board, said first metalization having as large a surface area substantially wider than its length in the direction of current flow and providing a second layer of metalization on the other side of said board in opposition to said first metalization and having an area congruent to that of said first metalization, connecting said first and second metalizations between said components and said power source, to produce a low impedance path and alternated flux pattern wherein the inductance produced is minimized.

17. The method according to claim 16, including the step of connecting said components and power source in said first and second metalization to each other so that the flow of current is transverse to the wider dimension of said layers.

18. The method according to claim 17, wherein the flow of current in the first metalization is opposite to that in said second metalization.

* * * * *

UNITED STATES PATENT AND TRADEMARK OFFICE
CERTIFICATE OF CORRECTION

PATENT NO. :     5,303,116
DATED      :     April 12, 1994
INVENTOR(S) :    Glenn F. Grotz It is certified that error appears in the above-identified patent and that said Letters Patent is hereby corrected as shown below:

```
Column 6, line 16:   "group" should be --ground--;

line 20:   "group" should be --ground--;

line 26:   "from" should be --form--; and

Column 7, line  1:   "device" should be --devices--.
```

Signed and Sealed this

Second Day of August, 1994

Attest:

BRUCE LEHMAN

*Attesting Officer*     *Commissioner of Patents and Trademarks*